(12) United States Patent
Oh et al.

(10) Patent No.: US 8,356,405 B2
(45) Date of Patent: Jan. 22, 2013

(54) METHOD OF MANUFACTURING PRINTED CIRCUIT BOARD

(75) Inventors: Chang Gun Oh, Gyunggi-do (KR); Ho Sik Park, Gyunggi-do (KR); Tae Kyun Bae, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 55 days.

(21) Appl. No.: 12/972,244

(22) Filed: Dec. 17, 2010

(65) Prior Publication Data

US 2012/0079716 A1    Apr. 5, 2012

(30) Foreign Application Priority Data

Oct. 4, 2010    (KR) .................. 10-2010-0096452

(51) Int. Cl.
*H05K 3/36* (2006.01)
(52) U.S. Cl. ............... 29/830; 29/832; 29/840; 29/852; 174/256; 174/257
(58) Field of Classification Search ............... 29/825, 29/830, 832, 840, 846, 852; 174/256, 257
See application file for complete search history.

(56) References Cited

U.S. PATENT DOCUMENTS

| | | | | |
|---|---|---|---|---|
| 4,642,160 A | * | 2/1987 | Burgess | 216/18 |
| 4,710,854 A | * | 12/1987 | Yamada et al. | 361/794 |
| 5,010,641 A | * | 4/1991 | Sisler | 29/830 |
| 6,378,201 B1 | * | 4/2002 | Tsukada et al. | 29/852 |
| 6,946,738 B2 | * | 9/2005 | Hsu et al. | 257/774 |
| 7,514,637 B1 | * | 4/2009 | En | 174/256 |
| 7,812,262 B2 | * | 10/2010 | En | 174/262 |

FOREIGN PATENT DOCUMENTS

CN    101472399 A   *  7/2009

* cited by examiner

*Primary Examiner* — Carl Arbes
(74) *Attorney, Agent, or Firm* — Blakely Sokoloff Taylor & Zafman LLP (57) ABSTRACT

Disclosed herein is a method of manufacturing a printed circuit board, including: providing a carrier including an insulation layer, first metal foils formed on both sides of the insulation layer, adhesive layers respectively formed on the first metal foils and made of a thermoplastic resin, and second metal foils respectively formed on the adhesive layers; applying resists having openings for forming metal posts onto both sides of the carrier; forming metal plating layers for forming the metal posts in the openings; grinding surfaces of the resists; removing the resist and forming insulation layers on both sides of the carrier; and grinding surfaces of the insulation layers. The method is advantageous in that both sides of a carrier are simultaneously layered, it is possible to prevent a substrate from warping during the process of manufacturing the printed circuit board.

16 Claims, 10 Drawing Sheets

METHOD OF MANUFACTURING PRINTED CIRCUIT BOARD

CROSS REFERENCE TO RELATED APPLICATION

This application claims the benefit of Korean Patent Application No. 10-2010-0096452, filed Oct. 4, 2010, entitled "Manufacturing method of printed circuit board", which is hereby incorporated by reference in its entirety into this application.

BACKGROUND OF THE INVENTION

1. Technical Field

The present invention relates to a method of manufacturing a printed circuit board.

2. Description of the Related Art

Generally, printed circuit boards (PCBs) are manufactured by patterning one or both sides of a substrate, composed of various thermosetting resins, using copper foil, and disposing and fixing ICs or electronic parts on the substrate to form an electric circuit and then coating the substrate with an insulator.

Recently, with the advance of the electronics industry, electronic parts are increasingly required to be highly functionalized, light, thin, short and small. Thus, printed circuit boards loaded with such electronic parts are also required to be highly densified and thin.

In particular, in order to keep up with the thinning of printed circuit boards, a coreless substrate which can decrease the thickness by removing a core and can shorten signal processing time is attracting considerable attention. However, a coreless substrate needs a carrier serving as a support during a process because it does not have a core.

Conventional methods of manufacturing a printed circuit board using a carrier are problematic as follows. First, the size of a substrate is changed as the substrate is cut because both edges of a printed circuit board are cut by a routing process during the procedure of separating a carrier from the substrate. Second, owing to the change in the size of the substrate, when solder resist is applied to the substrate, only thermosetting solder resist can be used because the application of the solder resist must be performed before the size of the substrate is changed. Third, in the process of manufacturing a coreless printed circuit board using a carrier, a laminating process is conducted in one side of a substrate, and thus the printed circuit board warps. Fourth, in the procedure of separating a carrier from a substrate, the carrier cannot be easily separated therefrom because of an adhesive. Fifth, the cost for forming laser holes for interlayer connections increases, and it is structurally limited to radiate heat.

SUMMARY OF THE INVENTION

Accordingly, the present invention has been devised to solve the above-mentioned problems, and the present invention intends to provide a method of manufacturing a printed circuit board, which can prevent the warpage of a printed circuit board by laminating and grinding both sides of a carrier, which can easily separate a carrier because a thermoplastic adhesive is used to form the carrier, and which can maintain the size of a printed circuit board constant even after the carrier has been separated from it.

An aspect of the present invention provides a method of manufacturing a printed circuit board, including: providing a carrier including an insulation layer, first metal foils formed on both sides of the insulation layer, adhesive layers respectively formed on the first metal foils and made of a thermoplastic resin, and second metal foils respectively formed on the adhesive layers; applying resists having openings for forming metal posts onto both sides of the carrier; forming metal plating layers for forming the metal posts in the openings; grinding surfaces of the resists; removing the resist and forming insulation layers on both sides of the carrier; and grinding surfaces of the insulation layers.

Here, the method may further include, after the grinding of surfaces of the insulation layers: forming circuit layers on the grinded insulation layers.

Further, the method may further include: forming build-up insulation layers and build-up circuit layers on the circuit layers.

Further, the method may further include, after the forming of the build-up insulation layers: separating the carrier to divide a substrate into an upper substrate and a lower substrate; removing a metal layer remaining on one side of the upper surface or the lower surface; grinding both sides of the upper substrate or the lower substrate; and forming build-up circuit layers on both sides of the grinded upper substrate or lower substrate.

Further, the method may further include, after the forming of the build-up circuit layers: forming solder resist layers on the build-up circuit layers; and surface-treating the build-up circuit layers excluding the solder resist layers.

Further, the first metal foil or the second metal foil may be copper foil.

Further, the metal posts may be copper posts.

Further, the applying of resists having openings for forming metal posts onto both sides of the carrier may include: applying the resists onto both sides of the carrier; and exposing and developing the applied resists to form openings in the resists.

Further, the forming of the circuit layer may include: forming a seed layer on the insulation layer; applying a plating resist onto the seed layer to form a circuit pattern; forming a circuit plating layer on the plating resist and then removing the plating resist; and removing the exposed seed layer.

Further, the forming of the seed layer may include: forming a tie layer by sputtering titanium (Ti), nickel (Ni) or chromium (Cr); and sputtering copper (Cu) onto the tie layer.

Further, the carrier may include an adhesive layer both sides of which are coated with metal foil.

Further, the metal foil may be copper foil.

Further, the insulation layer may be formed of semicured prepreg.

Further, the forming of the insulation layer may include: roughening the metal posts.

Further, the method may further include, after the grinding of the surface of the insulation layer: washing a surface of the insulation layer.

Further, in the forming of the metal plating layer for forming the metal posts in the openings, the metal plating layer may be formed such that it protrudes from the surface of the resist through the openings.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The objects, features and advantages of the present invention will be more clearly understood from the following detailed description of preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 1:
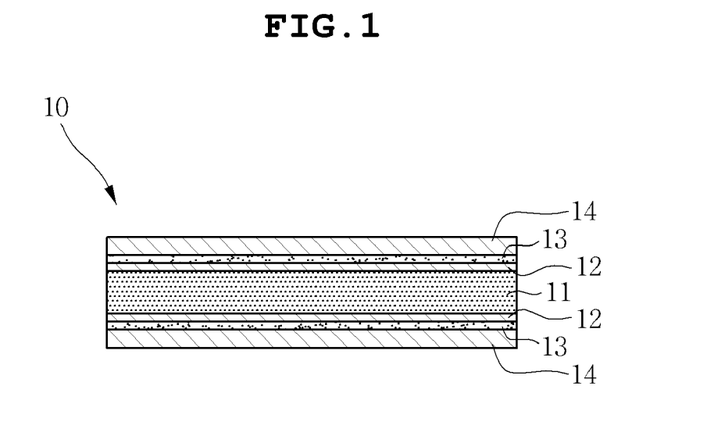
FIG. 1 is a sectional view showing a carrier according to an embodiment of the present invention.
Figure 2:
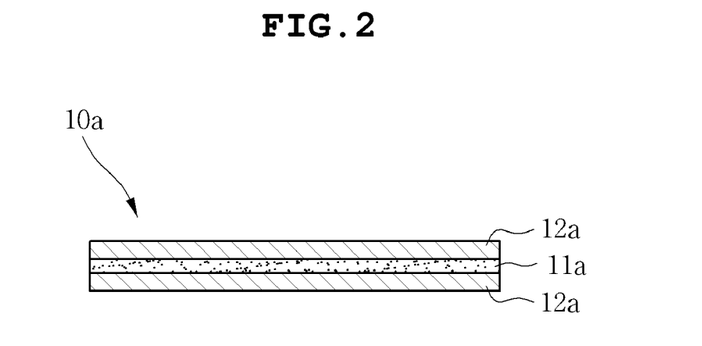
FIG. 2 is a sectional view showing a carrier according to another embodiment of the present invention.

FIG. 1 is a sectional view showing a carrier according to an embodiment of the present invention, and FIG. 2 is a sectional view showing a carrier according to another embodiment of the present invention.

As shown in FIG. 1, the carrier 10 according to an embodiment of the present invention includes an insulation layer 11, first metal foils 12 formed on both sides of the insulation layer 11, adhesive layers 13 respectively formed on the first metal foils 12 and made of thermoplastic resin, and second metal foils 14 respectively formed on the adhesive layers 13.

As the insulation layer 11 and adhesive layer 13 of the carrier 10, a semi-cured insulation layer, preferably, semi-cured prepreg may be used.

The first metal foil 12 and the second metal foil 14, which are respectively formed on both sides of the insulation layer 11 and the adhesive layer 13, may be copper foil. In addition to the copper foil, all kinds of metal foil may be used without limitation as long as they have the same properties.

The adhesive layer 13 made of thermoplastic resin is formed on the first metal foil 12, and is formed thereon with the second metal foil 14. The adhesive layer 13 made of thermoplastic resin, unlike a general adhesive layer, is advantageous in that metal foil easily adheres thereto because it has high adhesivity at 200 or lower and in that the carrier 10 is easily separated off during a process of manufacturing a printed circuit board because it has fluidity at 240 or higher.

The second metal foil 14 is formed on the adhesive layer 13 made of thermoplastic resin, thus forming the carrier 10. The process of manufacturing a printed circuit board begins with the carrier 10 formed in this way, and electroplating can be easily performed because the second foil 14 is formed at the outermost layer of the carrier 10.

As shown in FIG. 2, the carrier 10a according to another embodiment of the present invention includes a thermoplastic adhesive layer 11a and metal foil 12a formed on both sides of the thermoplastic adhesive layer 11a. Here, descriptions of the thermoplastic adhesive layer 11a and the metal foil 12a will be omitted because they overlap with those of the above mentioned first metal foil 12, second metal foil 14 and adhesive layer made of thermoplastic resin.

FIGS. 3 to 23 are sectional views showing a process of manufacturing a printed circuit board according to an embodiment of the present invention. Particularly, in this embodiment, a process of manufacturing a printed circuit board using the carrier shown in FIG. 1 will be described.

The method of manufacturing a printed circuit board according to this embodiment comprises: providing a carrier 10 including an insulation layer 11, first metal foils 12 formed on both sides of the insulation layer 11, adhesive layers 13 respectively formed on the first metal foils 12 and made of thermoplastic resin, and second metal foils 14 respectively formed on the adhesive layers 13; applying resists 20 having openings for forming metal posts 30a onto both sides of the carrier 10; forming metal plating layers 30 for forming metal posts 30a in the openings; grinding the surfaces of the resists 20; removing the resists 20 and forming insulation layers 40 on both sides of the carrier 10; and grinding the surfaces of the insulation layers 40.

The method of manufacturing a printed circuit board further comprises: forming a circuit layer 71 on the grinded insulation layer 40; and forming build-up insulation layers 41 and 42 and build-up circuit layers 72 and 73 on the circuit layer 71.

The method of manufacturing a printed circuit board further comprises, after forming the build-up insulation layers 41 and 42: separating the carrier 10 to divide a substrate into an upper substrate 1 and a lower substrate 2; grinding both sides of the upper substrate 1 or the lower substrate 2; and forming build-up circuit layers 72 and 73 on the grinded upper substrate 1 or lower substrate 2.

The method of manufacturing a printed circuit board further comprises, after forming the build-up circuit layers 72 and 73: forming a solder resist layer 80 on the build-up circuit layers 72 and 73; and surface-treating the build-up circuit layers 72 and 73 excluding the solder resist layer 80.

Hereinafter, the method of manufacturing a printed circuit board according to an embodiment of the present invention will be described in detail with reference to the attached drawings.

Figure 3:
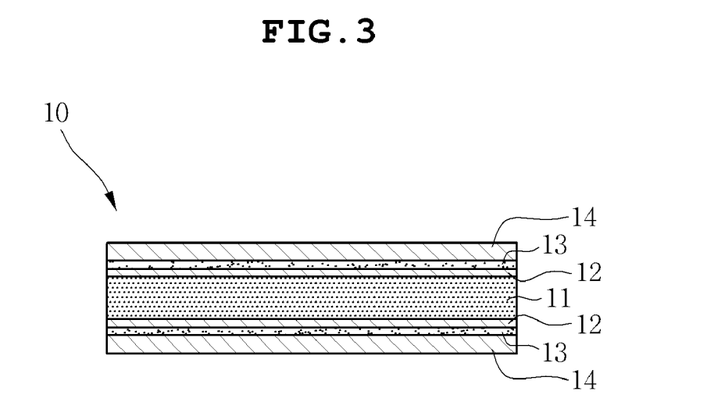
FIGS. 3 to 23 are sectional views showing a process of manufacturing a printed circuit board according to an embodiment of the present invention.

As shown in FIG. 3, a carrier 10 including an insulation layer 11, first metal foils 12 formed on both sides of the insulation layer 11, adhesive layers 13 respectively formed on the first metal foils 12 and made of thermoplastic resin, and second metal foils 14 respectively formed on the adhesive layers 13 is provided. A description of the carrier 10 will be omitted because the carrier 10 was previously described.

Figure 4:
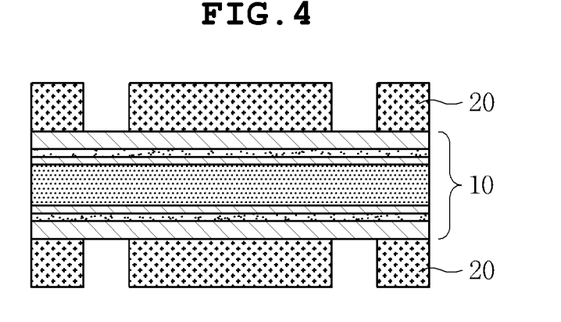

Subsequently, as shown in FIG. 4, a resist 20 having openings for forming metal posts 30a is applied onto both sides of the carrier 10. Here, the openings for forming metal posts 30a are formed by exposing and developing the resist 20. The resist 20 may be formed of a dry film or a liquid photosensitizing agent. Concretely, the openings for forming metal posts 30a are formed by an exposure process of adhering master film (not shown) closely to the resist 20 and then irradiating the resist 20 with ultraviolet and a developing process of removing the non-exposed resist 20.

Figure 5:
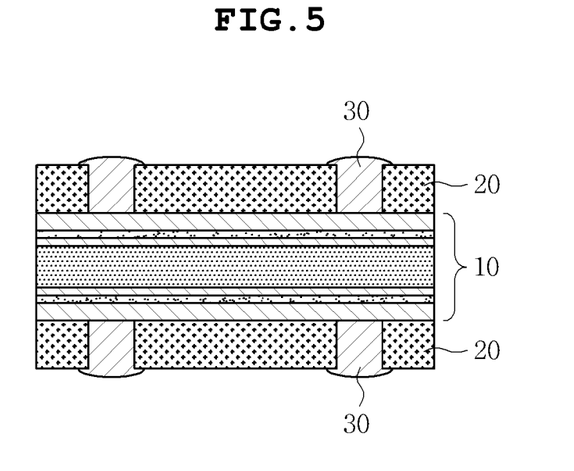

Subsequently, as shown in FIG. 5, a metal plating layer 30 is formed in the openings by electroplating in order to form metal posts 30a. In this case, the metal plating layer 30 is formed such that it protrudes from the surface of the resist 20, and is then flattened such that its surface is flush with the surface of the resist 20. Here, a copper (Cu) plating layer may be used as the metal plating layer 30, and another metal plating layer may used as the metal plating layer 30 as long as it has the same function and action as the metal plating layer 30. In this case, when the metal plating layer 30 is formed such that it protrudes from the surface of the resist 20 by controlling the plating time, the heights of the metal posts 30a can be equalized by the subsequent flattening process, and the metal plating layer 30 can be completely embedded in the openings formed in the resist 20.

Figure 6:
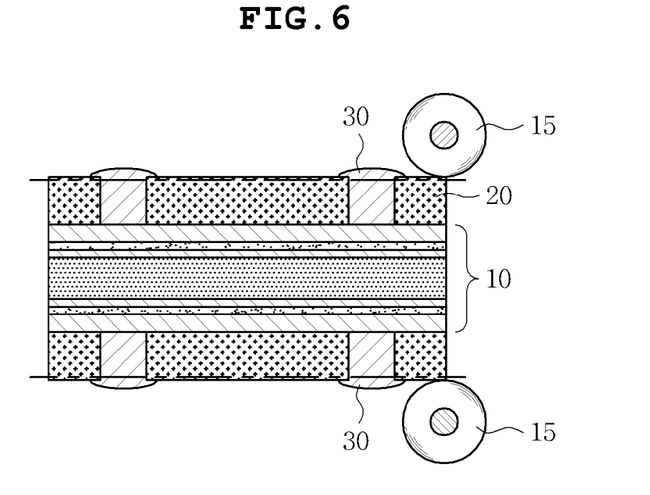

Subsequently, as shown in FIG. 6, both surfaces of the resist 20 embedded with the metal plating layer 30 are grinded. The metal plating layer 30 protruding from the surface of the resist 20 can be flattened by the grinding process. This flattening process equalizes the heights of the metal posts 30a, thus maintaining the insulation distance between wiring layers of a printed circuit board constant. The metal plating layer 30 may be grinded by mechanical grinding. As a grinding tool used in the mechanical grinding, a ceramic buff or a belt sander is generally used. However, the present invention is not limited thereto, and other grinding tools may be used as long as they have the same function and action as the buff or sander.

Figure 7:
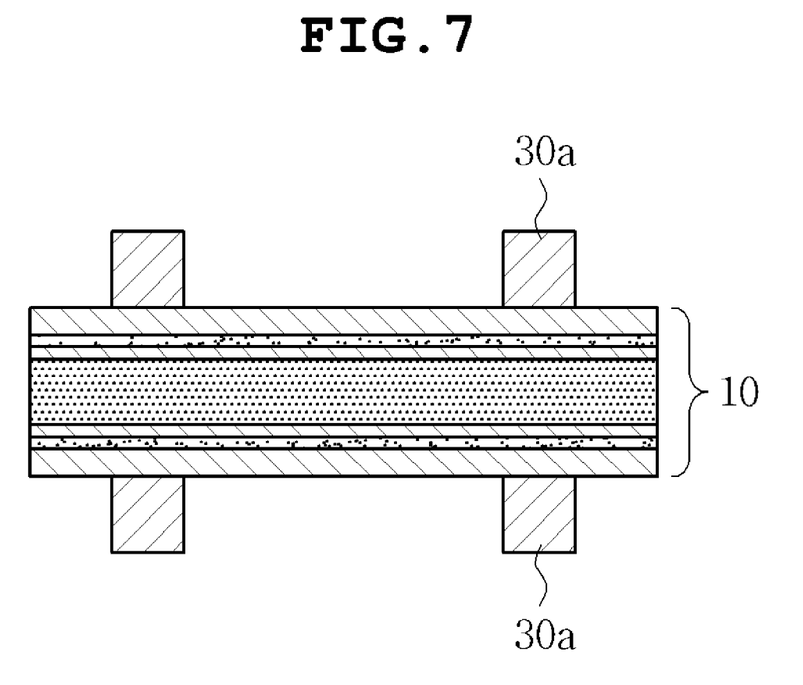

Subsequently, as shown in FIG. 7, the resist 20 is removed to form the metal posts 30a. As described above, the metal posts 30a may be copper posts. The metal posts 30a having the same height can be formed by forming a metal plating layer 30 in the openings of the resist 20 and then grinding the metal plating layer 30 to flatten the metal plating layer 30.

Figure 8:
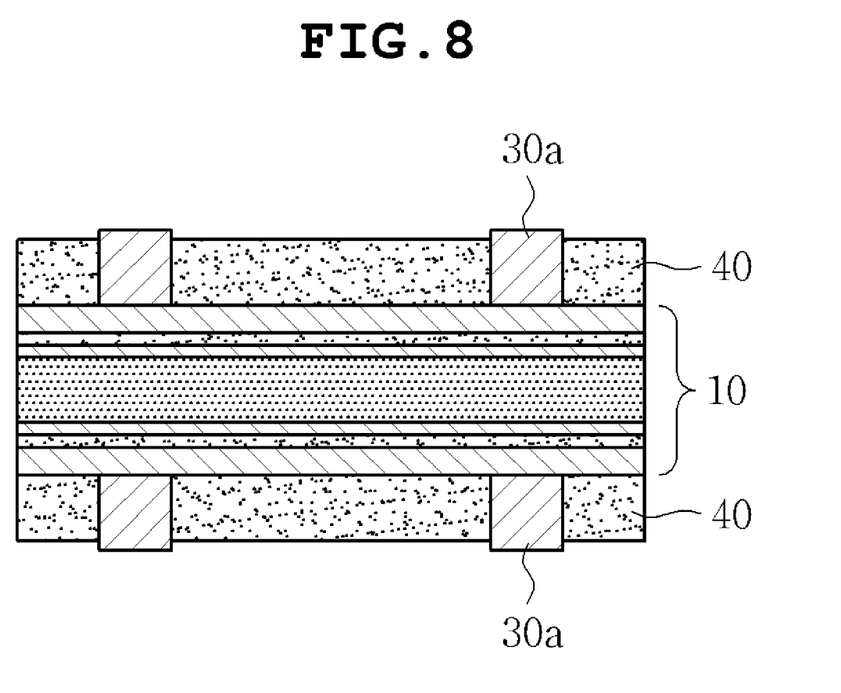

Subsequently, as shown in FIG. 8, an insulation layer 40 is formed on both sides of the carrier 10 such that it surrounds the metal posts 30a. In this case, the surface of the metal posts 30a may be roughened by chemical treatment in order to improve the adhesion between the insulation layer 40 and the metal posts 30a to ensure electrical reliability. The insulation layer 40 may be generally made of an epoxy resin, a polyimide resin, a liquid crystal polymer or the like. Particularly, in order to improve physical strength, the insulation layer 40 may be made of a glass fiber-containing insulating material such as prepreg.

Figure 9:
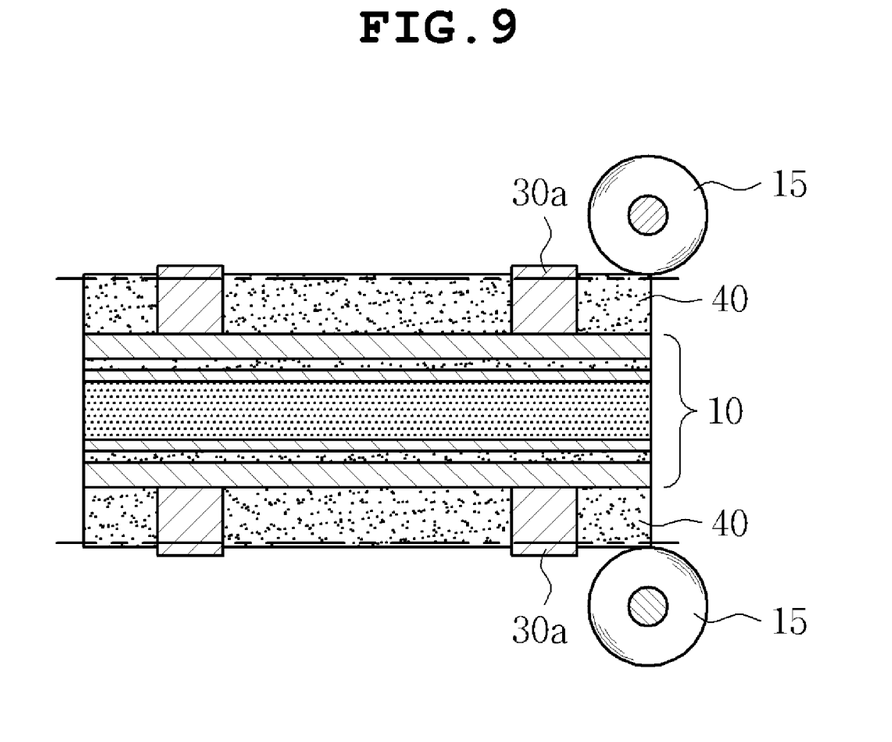

Subsequently, as shown in FIG. 9, the surface of the insulation layer 40 is grinded. Here, the insulation layer 40 is formed, and then insulation material and glass fiber remaining on the metal posts 30a are removed for the purpose of interlayer communication, and then the surface of the insulation layer 40 is grinded to even out the thickness of the insulation layer 40. In this case, the upper and lower surfaces of a substrate are simultaneously grinded, thus preventing the substrate from warping in the process of manufacturing a printed circuit board. The insulation layer 40 may be grinded by mechanical grinding. As a grinding tool used in the mechanical grinding, a ceramic buff or a belt sander is generally used. However, the present invention is not limited thereto, and other grinding tools may be used as long as they have the same function and action as the buff or sander.

Figure 10:
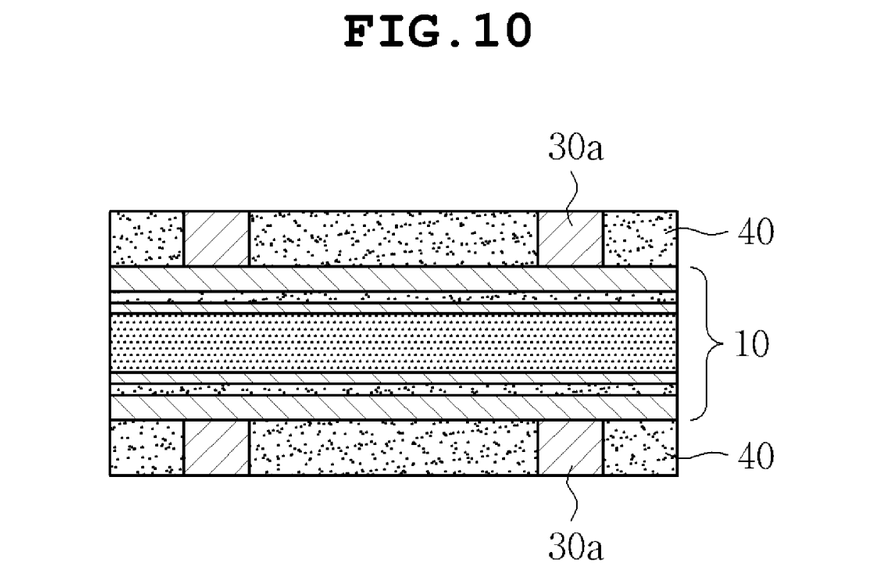

Subsequently, as shown in FIG. 10, the surface of the insulation layer 40 is washed. When the insulation layer 40 is flattened by mechanical grinding as shown in FIG. 9, burrs of an insulation material and metal particles of the metal posts 30a remain on the surface of the insulation layer 40, so that the surface of the insulation layer 40 is washed. That is, foreign substances are removed by a surface washing process. The surface washing process may be conducted by a general desmear process for removing impurities produced by forming holes in the process of manufacturing a printed circuit board.

FIGS. 11 to 15 are sectional views showing a process of forming a circuit layer 71 using a semi-additive method. The circuit layer 71 may be formed by a subtractive method in addition to the semi-additive method. The method of forming the circuit layer 71 is not limited thereto. The method of forming the circuit layer 171 using a semi-additive method comprises the steps of: forming a seed layer 50 on the insulation layer 40; applying a plating resist 60 onto the seed layer 50; forming a circuit plating layer 70 on the plating resist 60 and then removing the plating resist 60; and removing the exposed seed layer 50 by selective etching.

Figure 11:
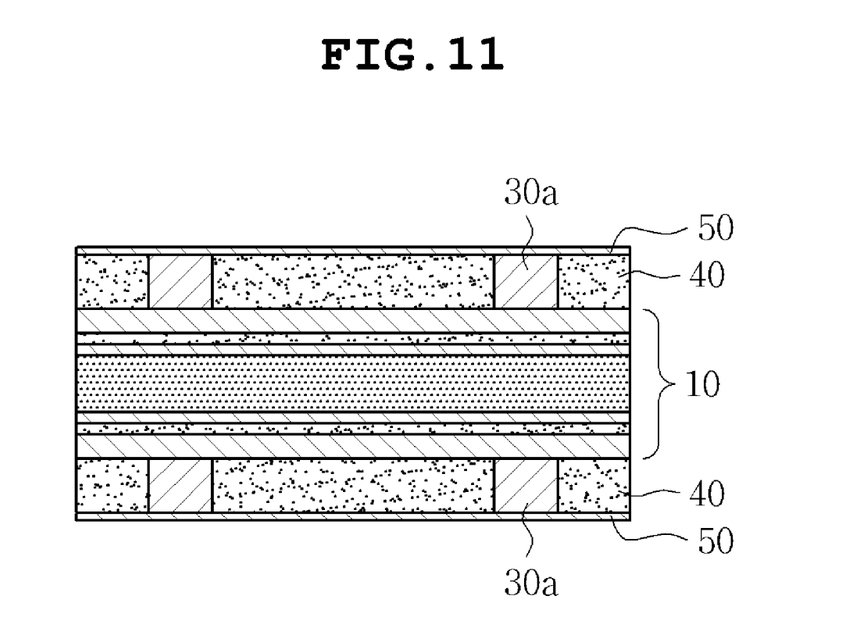

As shown in FIG. 11, a seed layer 50 for forming the circuit layer 71 is formed on the insulation layer 40. The seed layer 50, which serves as an incoming line for electroplating, may be formed by a wet plating method (electroless plating) or a dry plating method (sputtering). In the present invention, in order to improve the adhesion between the seed layer and the insulation layer, the seed layer is formed by forming a tie layer using titanium (Ti), nickel (Ni) or chromium (Cr) and then sputtering copper (Cu) onto the tie layer.

Figure 12:
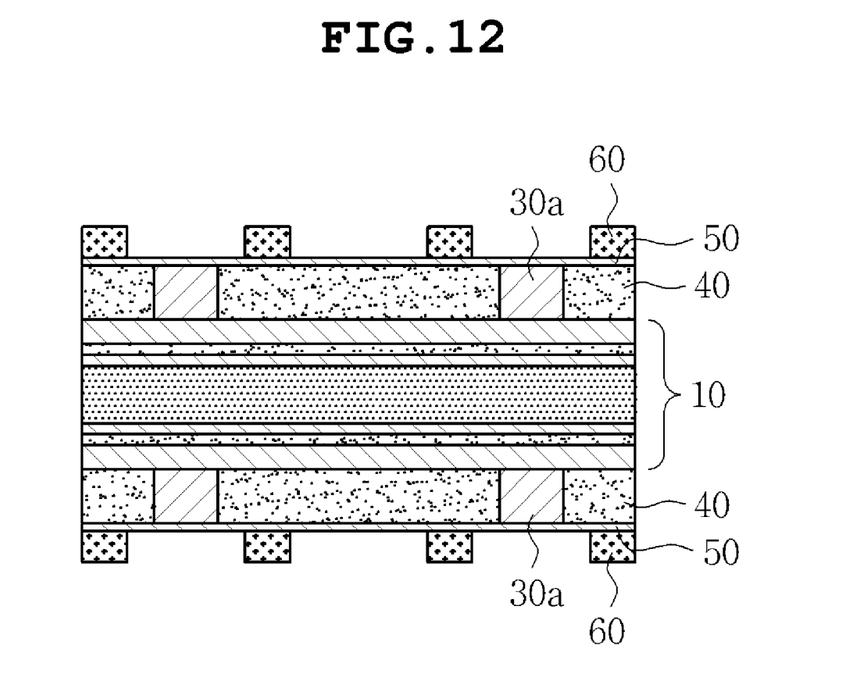
Figure 13:
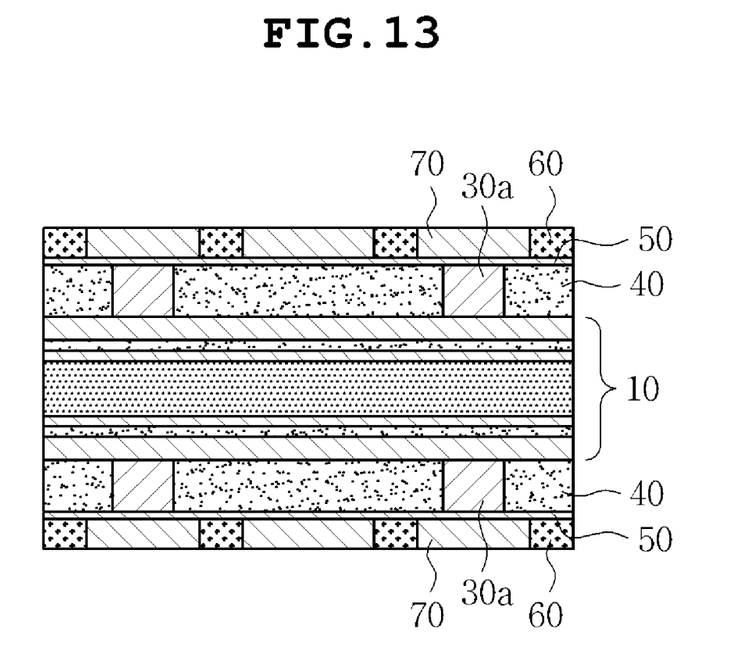
Figure 14:
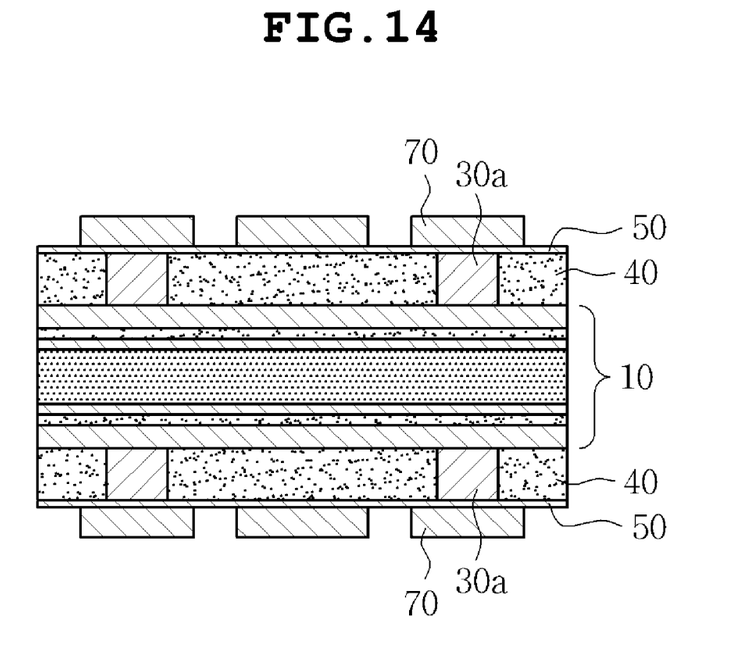
Figure 15:
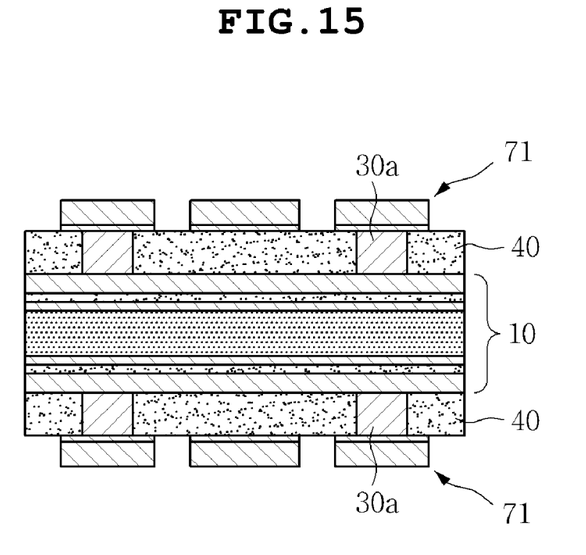

Subsequently, as shown in FIG. 12, a plating resist 60 for forming a circuit pattern is formed on the seed layer 50. Subsequently, as shown in FIG. 13, a circuit plating layer 70 is formed on the seed layer 50 such that it surrounds the plating resist 60. Subsequently, as shown in FIG. 14, the plating resist 60 is removed. Subsequently, as shown in FIG. 15, the exposed seed layer 50 is removed by selective etching to form the circuit layer 71.

Figure 16:
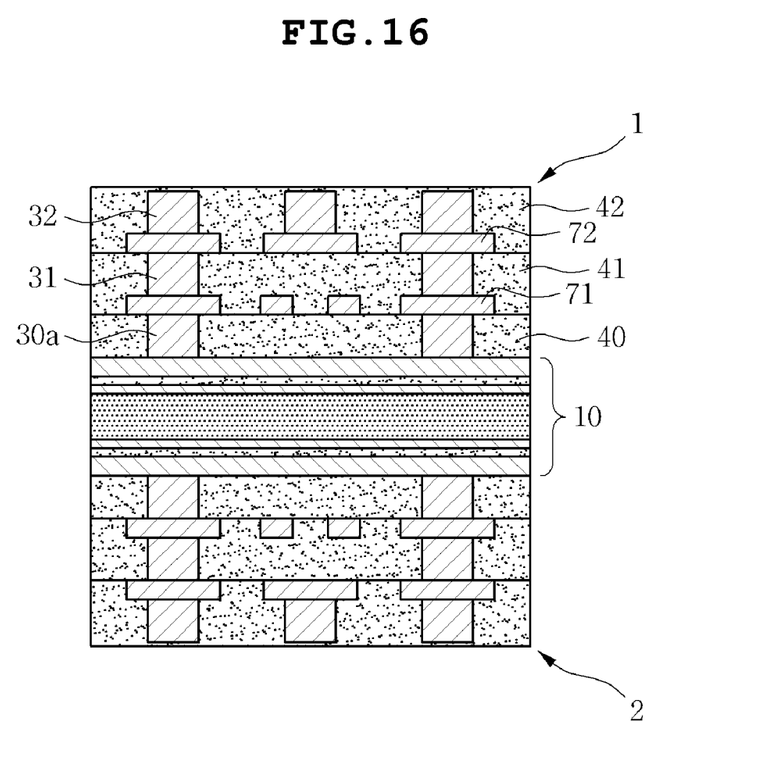

Subsequently, as shown in FIG. 16, build-up insulation layers 41 and 42 and a build-up circuit layer 72 are formed on the circuit layer 71. The build-up insulation layers 41 and 42 and the build-up circuit layer 72 are formed in order to manufacture a multilayered substrate. Detailed description of the build-up insulation layers 41 and 42 and the build-up circuit layer 72 will be omitted because they are formed in the same manner as in the above-mentioned insulation layer and circuit layer.

Figure 17:
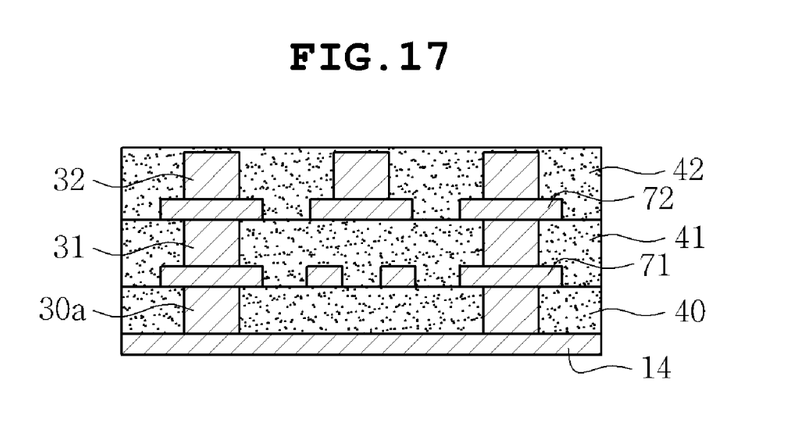

Subsequently, as shown in FIG. 17, the carrier is separated and removed from a substrate. In this case, the adhesive layer 13 made of a thermoplastic resin can also be easily separated from the substrate when the carrier 10 is separated from the substrate at high temperature. The substrate is separated into an upper substrate 1 and a lower substrate 2 when the carrier 10 is separated from the substrate.

Hereinafter, the upper substrate 1 or the lower substrate 2 is finally formed into a printed circuit board by the same processes.

Figure 18:
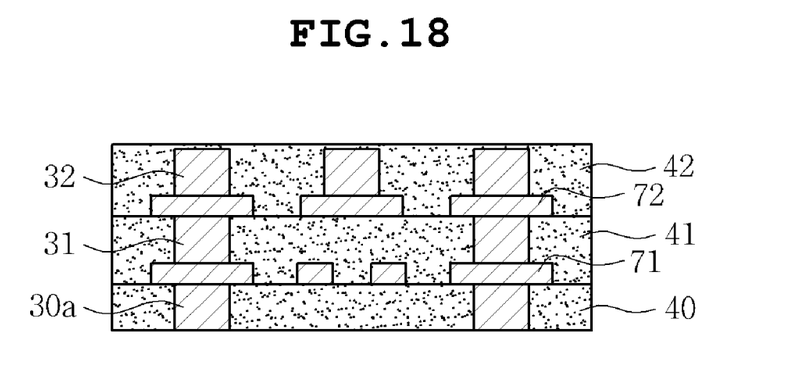

FIG. 17 shows the upper substrate 1. The second metal foil 14 which has been included in the carrier 10 remains on one side of the upper substrate 1, and is removed by a subsequent process. FIG. 18 shows the upper substrate 1 from which the second metal foil removed.

Figure 19:
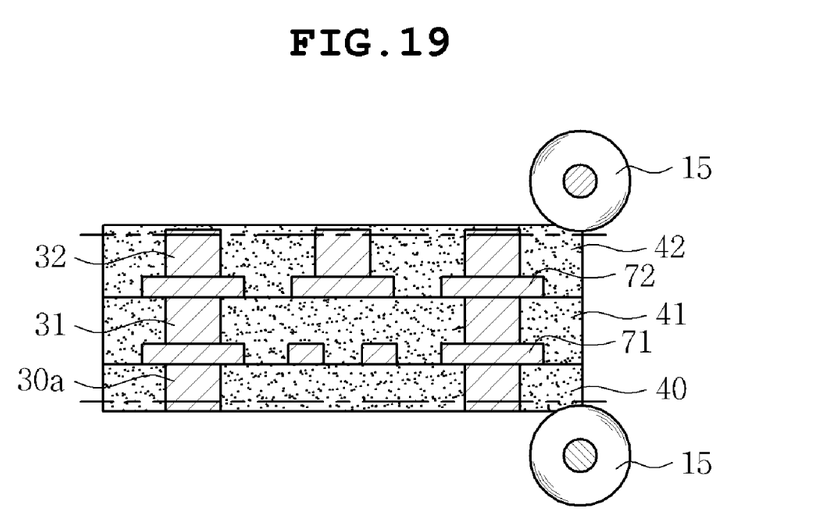
Figure 20:
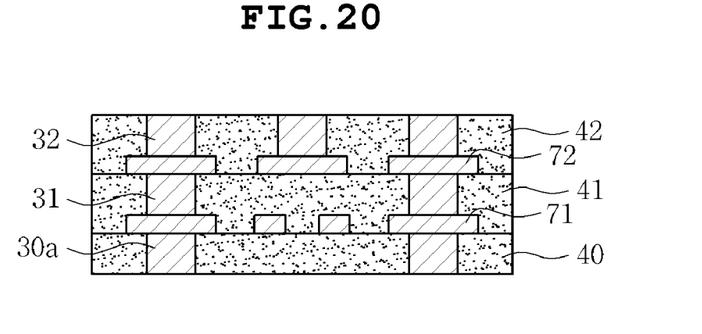

Subsequently, as shown in FIG. 19, both sides of the upper substrate 1 are flattened by a grinding process. FIG. 20 shows the upper substrate 1 flattened by the grinding process. Generally, in the process of fabricating a coreless substrate, since lamination is continuously performed only on one side of the carrier, insulation layers partially shrink when they are cured. Due to the constriction of the insulation layers, the substrate warps in one direction. Further, since only one side of the substrate is grinded, the grinded surface of the substrate shrinks, and thus the substrate warps in a direction opposite to the grinded surface thereof. Therefore, in the present invention, both sides of the upper substrate 1 separated from the carrier 10 are simultaneously grinded, thus preventing a substrate from warping. Concretely, owing to the grinding of both sides of the upper substrate 1, metal posts 30 can be exposed, and the warpage of the substrate can be prevented. Further, the balance of the substrate, attributable to the direction in which the substrate warps, can be maintained by properly controlling the grinding of both sides of the upper substrate 1.

Figure 21:
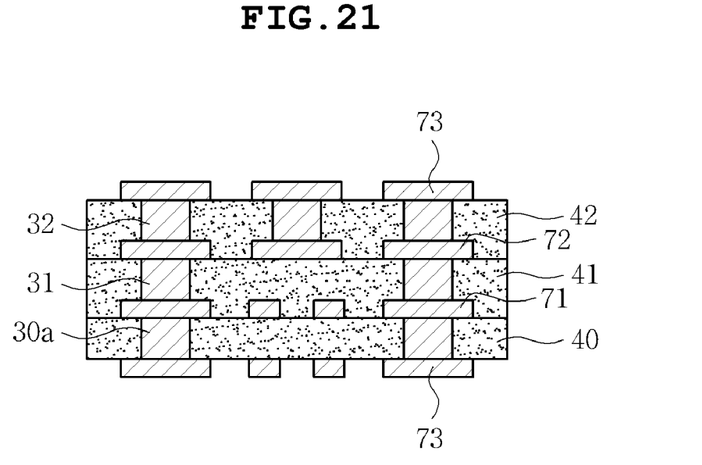

Subsequently, as shown in FIG. 21, build-up circuit layers 73 are formed on both sides of the upper substrate 1. Here, a description of the process of forming the build-up circuit layers 73 will be omitted because the process of forming the build-up circuit layer 73 overlaps with the process of forming the circuit layers shown in FIGS. 11 to 15.

Figure 22:
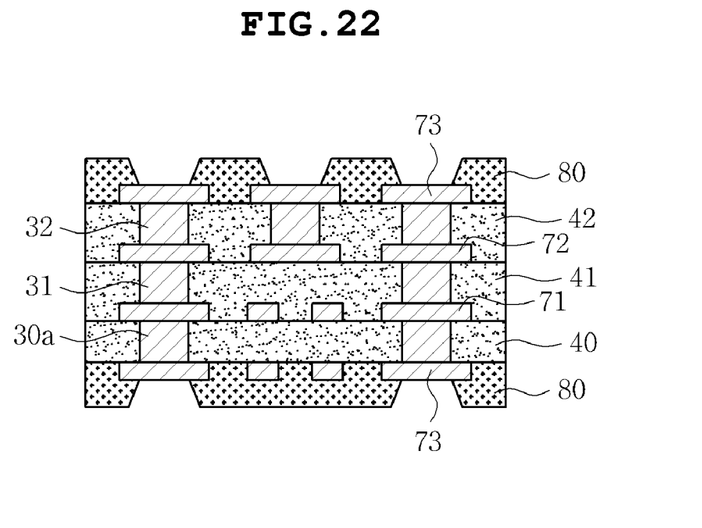

Subsequently, as shown in FIG. 22, a solder resist layer 80 is formed around each of the build-up layers 73. The solder resist layer 80 serves to prevent wiring patterns of a printed circuit board from coming into contact with foreign substances, prevent wirings from shorting, and prevent abnormal connection problems from occurring. Therefore, the solder resist layer 80 may be a film covering the portions excluding pads mounted with components. The solder resist layer 80 may be formed by screen printing, roller coating, curtain coating, spray coating or the like.

Figure 23:
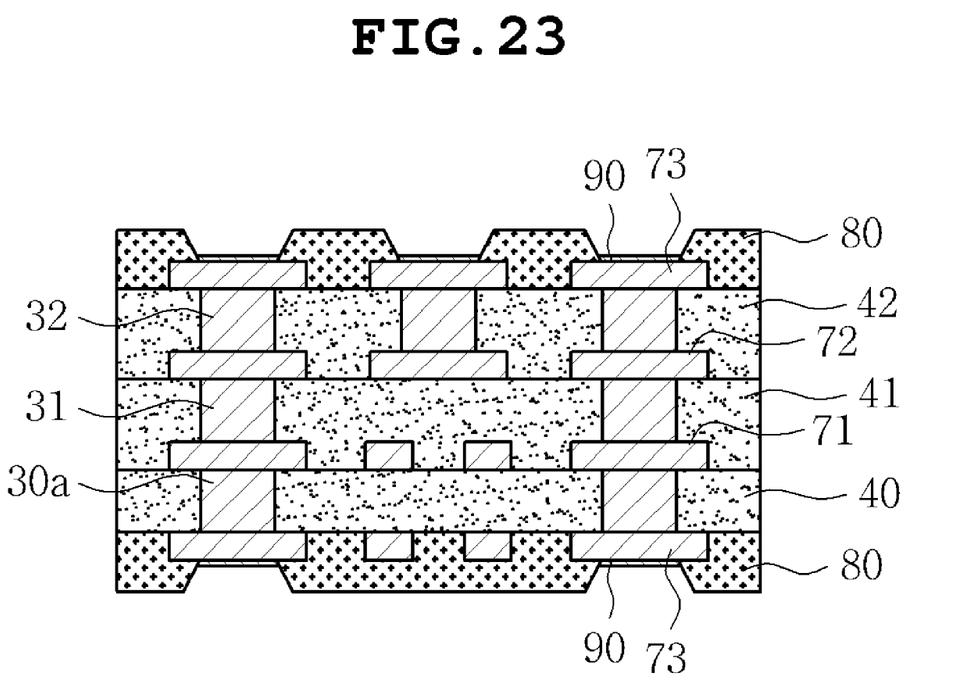

Finally, as shown in FIG. 23, a surface treatment layer 90 is formed on each of the build-up layers 73. The surface treatment layer 90 serves to prevent the copper foil of non-covered pads from being oxidized, to improve the solderability of components and to increase conductivity. The surface treatment layer 90 is generally formed by hot air solder leveling (HASL). In addition to the hot air solder leveling (HASL), the surface treatment layer 90 may be formed by various methods such as pre-flux coating, electroless silver (Ag) plating and the like.

As described above, according to the method of manufacturing a printed circuit board of the present invention, a printed circuit board can be manufactured without performing an additional cutting process in the process of separating a carrier, so that the size of the printed circuit board can be maintained constant, with the result that a thermosetting or photocurable solder resist can be selectively used.

Further, since both sides of a carrier are simultaneously layered, it is possible to improve the productivity of a printed circuit board and to prevent a substrate from warping during the process of manufacturing the printed circuit board.

Further, since a carrier is separated from a substrate and then both sides of an upper substrate or a lower substrate are grinded, it is possible to prevent a printed circuit board from warping.

Further, since a carrier including a thermoplastic adhesive is used, the thermoplastic adhesive is fluidized by high-temperature heat, and thus the carrier can be easily separated even with a small amount of force.

Further, an insulation layer is roughened, so that the adhesion between metal posts and the insulation layer is increased, thereby improving the electrical reliability attributable to the metal posts.

Further, when a seed layer is formed on the grinded surface of an insulation layer, the seed layer is formed by forming a tie layer using Ti, Ni, Cr or the like and then sputtering copper (Cu) onto the tie layer, so that the adhesion between the seed layer and the insulation layer is improved, thereby easily forming a circuit layer.

Furthermore, since metal posts are applied to the entire layer of a printed circuit board, the area of the metal posts can be controlled, thus improving the heat radiation characteristics of the printed circuit board.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Simple modifications, additions and substitutions of the present invention belong to the scope of the present invention, and the specific scope of the present invention will be clearly defined by the appended claims.

What is claimed is:

1. A method of manufacturing a printed circuit board, comprising:
  providing a carrier including an insulation layer, first metal foils formed on both sides of the insulation layer, adhesive layers respectively formed on the first metal foils and made of a thermoplastic resin, and second metal foils respectively formed on the adhesive layers, wherein the adhesive layers are separable from the first and the second metal foils at a predetermined temperature, thereby being removable from the carrier from an upper and a lower substrate;
  applying resists having openings for forming metal posts onto both sides of the carrier;
  forming metal plating layers for forming the metal posts in the openings;
  grinding surfaces of the resists;
  removing the resist and forming insulation layers on both sides of the carrier; and
  grinding surfaces of the insulation layers.

2. The method according to claim 1, further comprising, after the grinding of surfaces of the insulation layers: forming circuit layers on the grinded insulation layers.

3. The method according to claim 2, further comprising: forming build-up insulation layers and build-up circuit layers on the circuit layers.

4. The method according to claim 3, further comprising, after the forming of the build-up insulation layers:
  separating the carrier to divide a substrate into an upper substrate and a lower substrate;
  removing a metal layer remaining on one side of the upper surface or the lower surface;
  grinding both sides of the upper substrate or the lower substrate; and
  forming build-up circuit layers on both sides of the grinded upper substrate or lower substrate.

5. The method according to claim 4, further comprising, after the forming of the build-up circuit layers:
  forming solder resist layers on the build-up circuit layers; and
  surface-treating the build-up circuit layers excluding the solder resist layers.

6. The method according to claim 1, wherein the first metal foil or the second metal foil is copper foil.

7. The method according to claim 1, wherein the metal posts are copper posts.

8. The method according to claim 1, wherein the applying of resists having openings for forming metal posts onto both sides of the carrier comprises:
  applying the resists onto both sides of the carrier; and
  exposing and developing the applied resists to form openings in the resists.

9. The method according to claim 3, wherein the forming of the circuit layer comprises:

forming a seed layer on the insulation layer;

applying a plating resist onto the seed layer to form a circuit pattern;

forming a circuit plating layer on the plating resist and then removing the plating resist; and removing the exposed seed layer.

10. The method according to claim 9, wherein the forming of the seed layer comprises:

forming a tie layer by sputtering titanium (Ti), nickel (Ni) or chromium (Cr); and sputtering copper (Cu) onto the tie layer.

11. The method according to claim 1, wherein the carrier includes an adhesive layer both sides of which are coated with metal foil.

12. The method according to claim 11, wherein the metal foil is copper foil.

13. The method according to claim 1, wherein the insulation layer is formed of semicured prepreg.

14. The method according to claim 1, wherein the forming of the insulation layer comprises: roughening the metal posts.

15. The method according to claim 1, further comprising, after the grinding of the surface of the insulation layer: washing a surface of the insulation layer.

16. The method according to claim 1, wherein, in the forming of the metal plating layer for forming the metal posts in the openings, the metal plating layer is formed such that it protrudes from the surface of the resist through the openings.

* * * * *